United States Patent [19]
Epstein et al.

[11] Patent Number: 5,663,573
[45] Date of Patent: Sep. 2, 1997

[54] BIPOLAR ELECTROLUMINESCENT DEVICE

[75] Inventors: Arthur J. Epstein, Bexley; Yunzhang Wang; Darren Douglas Gebler, both of Columbus, all of Ohio

[73] Assignee: The Ohio State University, Columbus, Ohio

[21] Appl. No.: 406,512

[22] Filed: Mar. 17, 1995

[51] Int. Cl.$^6$ ..................................................... H01L 33/00
[52] U.S. Cl. ............................ 257/40; 257/99; 257/103; 313/501; 313/503; 313/504; 313/506
[58] Field of Search ........................... 257/103, 40, 99; 313/504, 503, 501, 506

[56] References Cited

U.S. PATENT DOCUMENTS

| | | | |
|---|---|---|---|
| 5,079,334 | 1/1992 | Esptein et al. | 528/210 |
| 5,142,343 | 8/1992 | Hosokawa et al. | 257/103 |
| 5,155,566 | 10/1992 | Nakayama et al. | 257/103 X |

FOREIGN PATENT DOCUMENTS 2251726   7/1992   United Kingdom .

OTHER PUBLICATIONS

Fou, A.C. et al., "Interlayer Interactions in Self–Assembled Poly(Phenlyene Vinylene) Multilayer Heterostructures, Implications for Light–Emitting and Photorectifying Diodes." in Nazri, G.A. et al., *Solid State Ionics IV*, Materials Research Society Symposium Proceedings, vol. 369, pp. 575–580, (Pennsylvania, Materials Research Society, Jul. 5, 1995).

Fou, A.C. et al., "Interlayer Interactions in Self–Assembled Poly(Phenlyene Vinylene) Multilayer Heterostructures, Implications for Light–Emitting and Photorectifying Diodes." Abstracts, 94 Fall Meeting, Materials Research Society, Nov. 27–Dec. 2, 1994, Boston Massachusetts, p. 628.

Romero, D.B., "Effects of Doping in Polymer Light–Emitting Diodes." *Applied Physics Letters*, vol. 67, No. 12 (18 Sep. 1995), pp. 1659–1661.

Yang, Z. et al., "Polymer Electroluminescence Using AC or Reverse DC Biasing." *Macromolecules*, vol. 28, No. 18 (Aug. 28, 1995), pp. 6151–6154.

Aratani, S., et al., "Improved Efficiency in Polymer Light–Emitting Diodes Using Air–Stable Electrodes." *Journal of Electronic Materials*, vol. 22, No. 22 (Nov. 7, 1993), pp. 745–749.

Bradley, D.D.C., "Conjugated polymer electroluminescence." *Synthetic Metals*, vol. 54 (1993), pp. 401–415.

Burroughs, et al., "Light–emitting Diodes Based on Conjugated Polymers." *Nature*, vol. 347 (1990), pp. 539–541.

Byrne, H.J., "Nonlinear Optical and Transport Properties in Fullerene Crystals and their Relationship to Crystal Structure." *Proceeding of the Electrochemical Society*, vol. 94 (1994), p. 603.

Fou, A.C. et al., "Interlayer Interactions in Self–Assembled Poly(Phenlyene Vinylene) Multilayer Heterostructures, Implications for Light–Emitting and Photorectifiying Diodes." Presentation at Symposium U3.21 Solid State Ionics, Materials Research Society, Boston Meeting 1994.

Fou, A.C. et al., "Molecular Level Processing of Electroactive Polymers for Thin Film Devices." *ANTEC '95*, (1995), pp. 1594–1595.

Fou A.C. et al., "Self–Assembled Multilayers of Electroactive Polymers: From Highly Conducting Transparent Thin Films to Light Emitting Diodes." *Proceedings of the American Chemical Society Division of Polymeric Materials: Science and Engineering*, vol. 72 (Spring Meeting, 1995), pp. 160–161.

Greenham, N.C., et al., "Efficient light–emitting diodes based on polymers with high electron affinities." *Nature*, vol. 365 (Oct. 14, 1993), pp. 628–630.

Jeglinski, S.A., et al., "Electrically Symmetric Poly(Phenylene Acetylene) Diodes." *Mol. Cryst. Liq. Cryst.*, vol. 256 (1994), pp. 555–561.

Mach, R., "Thin Film Electroluminescence Devices." in: Kitai, A. H., *Solid State Luminescence* (London, Chapman & Hall 1993), pp. 229–263.

Osaheni, John A., et al., "Spectroscopic and Morphological Studies of Highly Conducting Ion–Implanted Ridgid–Rod and Ladder Polymers." *Macromolecules*, vol. 25 (Nov. 21, 1992), pp. 5828–5835.

Romero, D.B., "Effects of Doping in Polymer Light-Emitting Diodes." *Bulletin of the American Physical Society*, vol. 40 (Feb. 10, 1995). [Abstract submitted for Meeting of the American Physical Society, San Jose, CA, Mar. 1995].

*Primary Examiner*—William Mintel
*Attorney, Agent, or Firm*—Philip J. Pollick

[57] ABSTRACT

Light-emitting bipolar devices consist of a light-emitter formed from an electroluminescent organic light-emitting material in contact with an insulating material. The light emitter is in contact with two electrodes that are maintained in spaced apart relation with each other. The light emitter can be formed as an integral mixture of light emitting materials and insulating materials or as separate layers of light-emitting and insulating materials. The devices operate with AC voltage of less than twenty-four volts and in some instances at less than five volts. Under AC driving, the devices produce modulated light output that can be frequency or amplitude modulated. Under DC driving, the devices operate in both forward and reverse bias.

70 Claims, 7 Drawing Sheets

BIPOLAR ELECTROLUMINESCENT DEVICE

BACKGROUND OF THE INVENTION

1. Field of the Invention

This invention relates to light-emitting devices driven by an electric field and which are commonly referred to as electroluminescent devices. In particular, this invention relates to electroluminescent devices having a light emitter formed from an electroluminescent light-emitting material and an insulating material and which is capable of being driven by either a positive or negative electric field, that is, the device is capable of being used with either a forward or reverse electrical potential. Most particularly, the invention relates to a light emitter capable of being driven by an alternating electric field, that is, the light emitter is capable or being driven by the alternating voltages associated with an alternating current in either a forward or reverse current direction.

2. Background

Inorganic electroluminescence devices were discovered by Destriau in 1936. Destriau observed that when suitably prepared inorganic zinc sulfide phosphor powders activated with small additions of copper, were suspended in an insulator and an intense alternating electric field (15 kV) applied with capacitor-like electrodes, light emission resulted. Electroluminescent research gained further impetus with the advent of transparent conducting electrodes based on tin oxide ($SnO_2$) in the late 1940's. Typically early devices were composed of two sheets of electrically conductive material serving as electrodes, one a thin conducting backing and the other a transparent conductive film, placed on opposite sides of a plastic or ceramic sheet impregnated with an inorganic phosphor, such as zinc sulfide doped with small amounts of copper or manganese. A transparent glass sheet placed next to the transparent conductive sheet served as an outermost protective substrate. Application of an alternating voltage to the electrodes caused an electric field to be applied to the phosphor. Each time the field would change, radiation of the wavelength of visible light was emitted. Although a large amount of research and investigation was conducted on the alternating current electroluminescent devices, the devices never achieved practical application although they were originally highly touted as a room lighting source. Unfortunately, at high brightness levels, the AC electroluminescent devices exhibited a very short life and after about 1963, most of the research into the AC electroluminescence devices was severely curtailed. The most recent efforts in this area have been directed to a molecular carbon (fullerene-60) system. The high voltage drive requirements, the associated high cost of drive circuitry, poor stability, and lack of color tunability have made these devices cost prohibitive.

Two other inorganic devices, 1) direct current (DC) inorganic semiconductor light emitting diodes (LEDs) and 2) fluorescent ion doped inorganic semiconductor thin film devices, trace their origins to the mid-fifties. Light emitting diodes based on forward biased inorganic semiconductor p-n junctions are limited to small area applications as a result of color, efficiency, and cost limitations. The other inorganic devices, fluorescent ion-doped inorganic semiconductor thin film devices, require high operating voltages to accelerate electrons or holes to sufficient energies in order to excite or ionize the fluorescent ion centers. Such high operating voltages result in thin-film instability and failure of such devices.

In the last decade, there has been an emerging interest in direct current (DC) molecular and polymer electroluminescence devices. A variety of organic molecules and conjugated polymers, copolymers, and mixtures have been found to exhibit electroluminescent properties. Light-emitting diodes incorporating these materials have demonstrated all of the necessary colors (red, green and blue) needed for display applications. However, a need continues to exist to lower the device operating voltages and to increase their light-emitting (output) efficiency. Further improvements in charge injection and the balancing of charge transport are needed. Because of the asymmetry of the device configuration, efficient charge injection occurs only in one direction (forward DC bias). Under reverse bias, most of the devices either degrade quickly or show very poor performance. Although efforts have been made to improve the charge injection efficiency by the use of low work function electrodes such as calcium or magnesium and the use of an electron transporting material to improve negative charge (electron) injection, such devices continue to be operational only in one direction. Similarly, efforts have been made to improve charge injection efficiency by the use of high work function electrodes such as indium tin oxide (ITO) or gold and the use of hole transporting materials to improve positive charge (hole) injection. Such devices also continue to be fully operational in only one direction. A need continues to exist to develop bipolar devices that have low turn on and operating voltages, flexibility, large area, high operating (light output) efficiency and low production cost.

It is an object of the present invention to provide an alternating or reversible direct voltage drive electroluminescent device.

It is an object of the present invention to provide a low operating voltage electroluminescent device.

It is an object of the present invention to provide an electroluminescent device using electroluminescent organic materials including organic molecules and organic polymers.

It is an object of the present invention to provide a flexible electroluminescent device.

It is an object of the present invention to provide a large electroluminescent area device.

It is an object of the present invention to provide a device with a longer lifetime.

It is an object of the present invention to provide an electroluminescent device with high emissive light output.

It is an object of the present invention to provide frequency modulated light output.

It is an object of the present invention to provide amplitude modulated light output.

SUMMARY OF THE INVENTION

These objects have been met with the present invention of a bipolar electroluminescent organic material device. This device features a light emitter composed of an electroluminescent organic light-emitting material in contact with an insulating material. The light emitter is also in electrical contact with a first electrode and a second electrode with the first and second electrodes arranged in spaced relation with each other. The first electrode and the second electrode are electrically connected to a potential difference in either direction. That is, the first electrode can be connected to a positive potential (anode) while the second electrode is connected to a negative potential (cathode) or the connections can be reversed, with the first electrode connected to a negative potential while the second electrode is connected to a positive potential (opposite current direction). Since the device can be operated in either current direction with similar output efficiency, the device is referred to as a bipolar device. Such an arrangement of electroluminescent organic light-emitting material and insulating material and the first and second electrodes is of particular advantage in that it allows the device to be driven with an alternating voltage, that is, the device can and is preferably used with an alternating current.

A wide variety of electroluminescent organic light-emitting materials, insulating materials and electrode materials can be used in the device. The organic light-emitting material and the insulating material contact each other to form the light emitter. The light emitter is in electrical contact with two electrodes that are themselves in spaced apart relation to each other. The electrodes are attached to a potential difference in either polarity and preferably to an alternating potential difference associated with alternating current. The light emitter can be fabricated in many ways including 1) as a mixture of insulating material and light-emitting material, 2) as a layer of insulating material in contact with the light-emitting material, and 3) as a layer of light-emitting material sandwiched between two layers of contacting insulating material. As used here, the term mixture is defined to include both uniform and nonuniform distributions of components and is inclusive of terms such as blends and dispersions. When a single layer of insulating material is used together with light-emitting material(s), one of the electrodes is in contact with the light-emitting material and the second electrode is in contact with the insulating material. In such cases, the first electrode, which is in contact with the insulating material, preferably has a higher electron work function than the second electrode. When two layers of insulating material sandwich the light-emitting material, one of the electrodes contacts one of the insulating layers while the other electrode contacts the other insulating layer.

Electroluminescent organic light-emitting materials include both molecular and polymer forms. These materials include light-emitting polymeric polypyridines such as poly (p-pyridines), copolymers such as poly(phenylenevinylene pyridylvinylene) and light-emitting molecules such as 8-hydroxyquinoline. Insulating materials include a wide variety of ceramics such as aluminum oxide and inorganic and organic materials such as polysilane, polymethylmethacylate, nylon, emeraldine base (an insulating polyaniline polymer) and organic molecules such as 2-(4-biphenyl)-5-(4-tert-butylphenyl)-1,3,4 oxdiazole. Electrodes can be fashioned from any suitable conductor including, but not limited to, a wide variety of conducting materials including 1) indium tin-oxide, 2) metals such as gold, aluminum, calcium, silver, copper, indium, 3) alloys such as magnesium-silver, 4) conducting fibers such as carbon fibers, and 5) highly-conducting organic polymers such as highly-conducting doped polyaniline and highly-conducting doped polypyrrole.

In typical applications where the device is used for lighting and display, at least one of the electrodes is fashioned from a transparent material such as indium tin oxide or a partially transparent material such as highly-conducting doped polyaniline. The insulating material may also be transparent or partially transparent and fabricated from an optically clear insulating polymer such as polymethylmethacylate or a partially transparent insulating polymer such as the insulating emeraldine base form of polyaniline. Partially transparent electrodes and insulators can be used to advantage to filter or clip unwanted portions (frequencies) of light coming from the organic light-emitting material.

For ease of manufacture and safety purposes, it is often desirable to form the device on a substrate which also serves to protect and often insulates (both physically and electrically) the device during use. Glass or clear electrically insulating plastic substrates are preferable when the device is used for lighting and display purposes. An AC driven device is especially suitable for light emission from both sides of the device in which case all of the insulating material and electrode materials are at least partially transparent as well as any protective substrates that may be used with one or both electrodes.

It is noted that it is not necessary that either the electrode material or insulating material be transparent or even partially transparent. In cases where the insulating and electrode materials are opaque to the emitted light, light emission from the edge of the device may be utilized in, for example, coupling applications such as in coupling the device to an optical fiber. Since the device can be AC driven, it has the advantage of delivering modulated light output in frequency modulated or amplitude modulated form.

The invention features a relatively low turn-on and operating AC or DC voltage of less than about 24 volts. More preferably a turn-on and operating voltage of less than about 12 and less than about 6 volts have been achieved. In some cases a turn-on and operating voltage of less than about 5 volts has been achieved. These low voltages make these devices particularly advantageous for use in toys, as commercial light strips such as found on airplanes and in theaters, as signs, and as flat panel displays for computer and television use.

The foregoing and other advantages of the invention will become apparent from the following disclosure in which one or more preferred embodiments of the invention are described in detail and illustrated in the accompanying drawings. It is contemplated that variations in procedures, processing, structural features, arrangement of parts, experimental design, ingredients, compositions, compounds, and elements may appear to a person skilled in the art without departing from the scope of or sacrificing any of the advantages of the invention.

Aluminum device of Example IX showing voltage on the horizontal axis in volts (V) and current on the vertical axis in milliamperes (mA).

Figure 7:
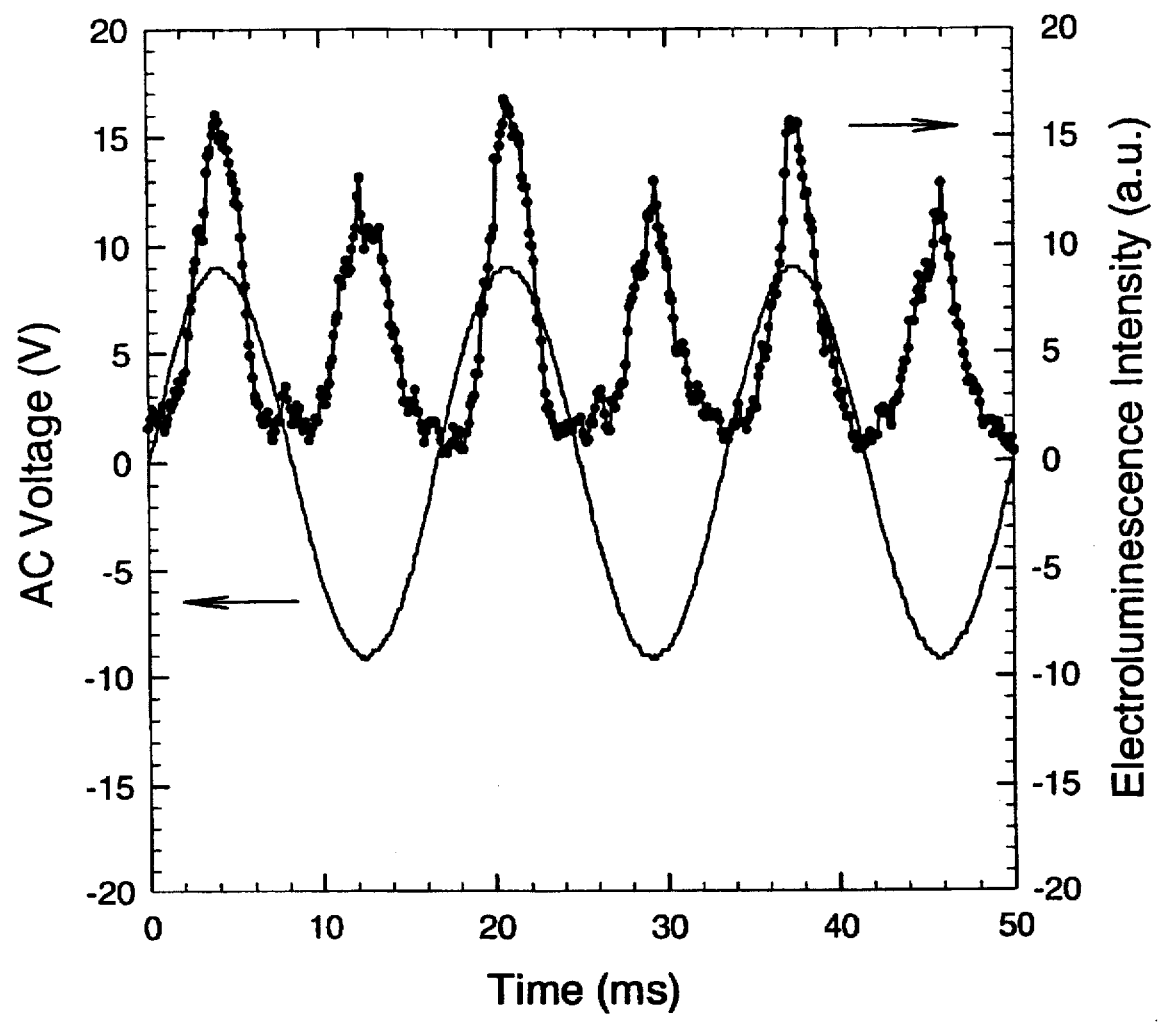

FIG. 7 is a plot showing light intensity and AC voltage as a function of time for the Indium Tin Oxide/ Polymethylmethacrylate/Poly(p-pyridylvinylene)/ Aluminum device of Example IX. AC voltage in volts (V) is shown on the left vertical axis, light intensity in arbitrary units (a.u.) is shown on the right vertical axis, and time in milliseconds (ms) is shown on the horizontal axis.

In describing the preferred embodiment of the invention which is illustrated in the drawings, specific terminology is resorted to for the sake of clarity. However, it is not intended that the invention be limited to the specific terms so selected and it is to be understood that each specific term includes all technical equivalents that operate in a similar manner to accomplish a similar purpose.

Although a preferred embodiment of the invention has been herein described, it is understood that various changes and modifications in the illustrated and described structure can be affected without departure from the basic principles that underlie the invention. Changes and modifications of this type are therefore deemed to be circumscribed by the spirit and scope of the invention, except as the same may be necessarily modified by the appended claims or reasonable equivalents thereof.

DETAILED DESCRIPTION OF THE INVENTION AND BEST MODE FOR CARRYING OUT THE PREFERRED EMBODIMENT

Figure 1:
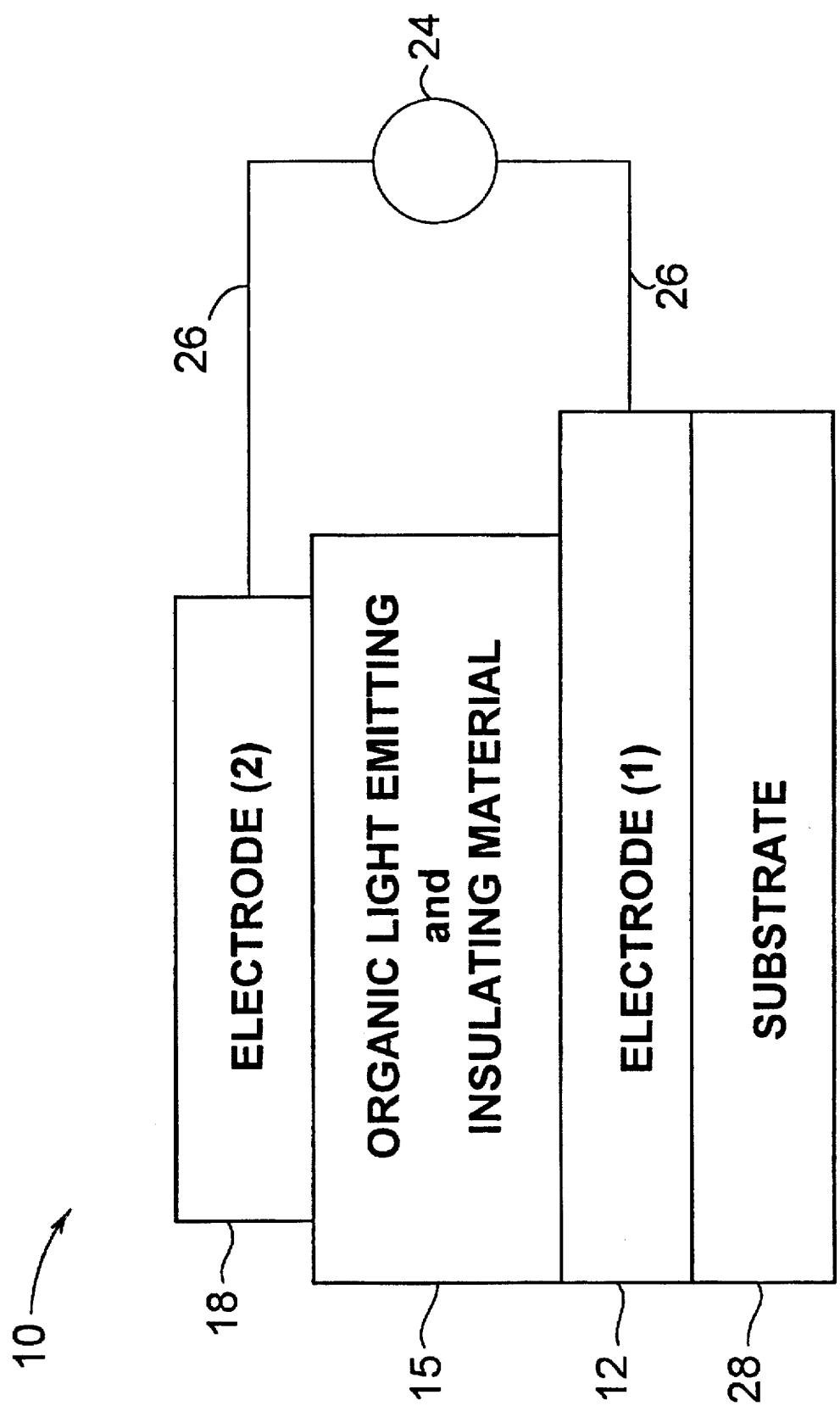
FIG. 1 is a schematic drawing of the bipolar device of the present invention.

As shown in FIG. 1, the current invention generally denoted by the number 10 consists of, in its basic form, a light emitter 15 formed from an electroluminescent organic light-emitting material and an electrically insulating material in contact with the organic light-emitting material. Both a first electrode 12 and a second electrode 18 are in electrical contact with light emitter 15 with the first and second electrodes 12 and 18 maintained in spaced relation with each other. The first electrode 12 and the second electrode 18 are connected to a voltage source 24 by electrical connectors 26. Voltage source 24 can be a direct voltage source connected in either direction, that is, connected to produce a current that flows in either a forward or reverse direction. The voltage source 24 can also advantageously be an alternating voltage source producing an alternating current.

As used here, the term organic light-emitting material refers to an electroluminescent organic material that converts electric energy into electromagnetic radiation. Typically the wavelength of the output electromagnetic radiation (light) falls in the range from ultraviolet to near infrared, that is, from about 250 nanometers to about 2500 nanometers. Preferably the wavelength of the output radiation is in the range from about 300 to about 1200 nanometers.

The electroluminescent organic light-emitting material can be chosen from a wide variety of organic light-emitting materials including both molecular and polymeric light-emitting materials. The preparation and use of such materials is well known to those skilled in the art. As used here, the term polymeric material is used for materials having repeating structural units in the chemical structure such as, for example, H—$(C_6H_4)_n$-H (poly(phenylene)) whereas the term molecular material is used for materials having only one structural unit such as, for example, $C_9H_7NOH$ (8-hydroxyquinoline). Representative polymeric organic light-emitting groups include groups such as, but not limited to, polypyridines, polypyridylvinylenes, polythiophenes, polyphenylenes, polyphenylenevinylenes, rigid-rod polymers such as the polyphenylenebenzobisthiazoles and polybenzimidazobenzophenanthrolines, polyfluorenes, polyvinylcarbazoles, polynaphthalenevinylenes, polythienylenevinylenes, polyphenyleneacetylenes, polyphenylenediacetylenes, and polycyanoterephthalylidenes. A wide variety of specific materials (derivatives) can be found in each of these groups as a result of modifications to the basic structure, typically as a result of substitution of electron donating and withdrawing groups according to techniques well-known to those skilled in synthetic organic chemistry. Electron-donating groups that can be substituted on the structures of the above light-emitting polymer groups can include, but are not limited to, —R, —OR—, halogens (electron donating by means of a resonance effect), —$NR_2$, —NHCOR, —OH, —O—, —SR, —OR, and —OCOR where R is an alkyl, aryl or arylalkyl group. Electron withdrawing groups can include halogens (electron withdrawing by way of an inductive effect), —$NO_2$, —COOH, —COOR, —COR, —CHO, and —CN. As with the electron donating groups, R is an alkyl, aryl or arylalkyl group. Nitrogen containing light emitting groups also include the quaternized form of the nitrogen atom. In addition, these materials can be copolymerized or mixed with other light-emitting polymers and molecules and non-light emitting polymers and molecules to give a wide variety of materials with a broad range of properties including a wide range of color outputs, light emission efficiencies, lifetimes, and mechanical properties such as flexibility and ease of fabrication. Illustrative specific polymeric derivatives from various light emitting polymeric groups include polypyridines (poly(p-pyridine)); polypyridylvinylenes (poly(p-pyridylvinylene)); polyphenylenes (poly(p-phenylene), polyphenylenevinylenes (poly(p-phenylenevinylene), poly(2,5-dimethoxy-p-phenylenevinylene), poly(2-methoxy-5-(2'ethylhexoxy)-p-phenylenevinylene), and poly(2,5-bis(cholestanoxy)-p-phenylenevinylene); polyphenylenebenzobisthiazoles (poly (p-phenylenebenzobisthiazole)); polythiophenes (poly(3-alkyl)thiophene and especially poly(3-hexylthiophene)); polyfluorenes (poly(9-alkylfluorene)); polyvinylcarbazoles (poly(N-vinylcarbazole); and polynaphthalenevinylene (1,4-naphthalenevinylene). Representative electroluminescent organic light-emitting molecules include 8-hydroxyquinoline, naphthostyrylamine, perylene, anthracene, coronene, rhodamine B, and 12-phthaloperinene. As with the polymeric materials, these materials can also be mixed with other light-emitting molecules and polymers or non light-emitting molecules and polymers to give a wide range of light-emitting materials.

As used here, the term electrically insulating material or alternatively, insulator or electrical insulator, refers to a material that is a poor conductor of electricity. Typically the resistivity of the insulating material is greater than about $10^5$ ohm-cm. The preferred resistivity range is about $10^8$ to about $10^{13}$ ohm-cm. A wide variety of electrical insulating materials can be used in the present invention including conventional ceramics, organic materials and inorganic polymers. Ceramic materials include, for example, glass, alumina, beryllia, porcelain, zirconia, carbides, nitrides, and silicon nitrides. Organic insulating materials include acrylonitrile-butadienestyrenes, acetals, acrylics, chlorinated polyethers, polyvinylcarbazoles, fluorocarbons, nylons, parylenes (polyparaxylylenes), phenoxies, polyamide-imides, polyimides, polycarbonates, polyethylenes, polypropylenes, polyethylene terephthalates, polyphenylene oxides, polystyrenes, polysulfones, conjugated polymers, copolymers thereof and mixtures thereof. As used in this document, the term mixture also includes blends and dispersions. The conjugated polymers include materials such as the polythiophenes and the insulating forms of the polyanilines such as emeraldine base with an imine to amine ratio of about 0.4 to about 2.5 and various derivatives as more fully described in U.S. Pat. No. 5,079,334 all of which is herein incorporated by reference. Insulating organic molecules such as 2-(4-biphenyl)-5-(4-tert-butylphenyl)-1,3,4-oxadiazole may also be used as the insulating material. To facilitate the use of such insulating organic molecules they are often dispersed in a host polymer such as insulating emeraldine base or a polyvinylcarbazole. Inorganic polymers include both purely inorganic and inorganic-organic polymers such as siloxanes, phosphazenes, and silicones. These materials can be copolymerized or mixed with each other to give a wide variety of materials with a broad range of properties including insulating characteristics, flexibility or stiffness, and processability.

The light emitter 15 which comprises an insulating material and an organic light emitting material can be formed in a variety of ways including as mixtures of insulating materials and organic light emitting materials or as a layered structure having at least one layer of insulating material contacting the light emitting material but preferably as two layers of insulating material both contacting the emitting material in sandwich fashion. See copending application Ser. No. 08/396,465 filed Mar. 2, 1995 and having a common assignee all of which is incorporated by reference as if completely written herein. The various insulating materials and light emitting materials noted above can be mixed to form a wide variety of compositions that can be dispersed in either a uniform (homogeneous) or non-uniform (non-homogeneous) fashion according to a wide variety of methods known to those of skill in the art. When polymeric materials are used for both the insulating and light-emitting materials, the resulting light emitter can exist as a mixture interpenetrating polymer networks. For layered insulating materials, the thickness of the insulating materials is preferably about 0.5 nm to about 10,000 nm, with high resistance materials such as $Al_2O_3$ having a thickness of about 1 to about 300 nm and lower resistance materials such as insulating emeraldine base having a thickness of about 10 to about 10,000 nm. The light emitting material should have a thickness of about 10 nm to about 1000 nm with a thickness of about 20 nm to about 200 nm being preferred. Mixtures of insulating materials and light emitters can be used in a wide variety of proportions, it being realized that as the concentration of light emitter decreases to very low levels, light emission intensity generally decreases. Typically light emitter concentrations of about 5 to 80 weight percent are preferred with a more preferable range being about 10 to about 60 weight percent light emitter.

A wide variety of electrode materials can be used as the electrodes of the present device including 1) indium tin-oxide, 2) metals including calcium, aluminum, indium, gold, copper, silver, 3) alloys such as magnesium/silver, 4) conducting non-metals such as carbon and graphite fibers and filaments, and 5) highly-conducting polymers such as polyaniline doped with dopants such as camphor sulfonic acid, hydrochloric acid, tosylic acid, and dodecylbenzene sulfonic acid and polypyrrole doped with phosphorous hexafluoride and p-toluenesulfonate. As used here a highly conducting polymer is a polymer with a conductivity of more than about $10^{-2}$ S/cm and preferably more than about $10^{-1}$ S/cm. In fabricating the devices of this invention, the electrodes are of sufficient thickness to provide electrical continuity.

For many applications, it is desirable to use a transparent electrode such as indium tin-oxide and a transparent insulator such as polymethylmethacrylate. It is often preferable to fabricate the device using a suitable substrate 28. Typically the substrate is an insulating material such as a plastic or glass. Glass and optical plastics such as polymethylmethacrylates, polycarbonates, polystyrene, methylpentene, and various copolymers and mixtures may be used when light transmission is desired.

For ease of manufacture, a substrate 28 is used to fabricate the layered structure shown in FIG. 1. Although it is not necessary for the operation of device 10, it is convenient to use such a substrate in device fabrication. In addition, the substrate serves as a protective surface for the adjacent electrode. In addition, a second substrate (not shown) can be used in conjunction with the second electrode. The substrates are usually non-conducting materials with properties that depend greatly on the application of the device. Protective substrates may be opaque, transparent or partially transparent to the emitted light and made from a wide variety of ceramic, inorganic, and organic materials. Very often it is preferable to have a transparent substrate especially when the device is used for lighting or as a display device. In such instances it is desirable to have an optically clear material. Many of the materials used as insulating materials may also be used as a substrate material. A wide variety of materials are available with plastics being especially useful because of fabrication ease. Further details are available in many reference books such as *Engineered Materials Handbook*, Vol. 2, "Engineering Plastics" and especially the chapters on "Electrical Properties," p. 460 and "Optical Properties," p. 481.

Generally, the device shown in FIG. 1 is prepared using a spin casting technique. First, a commercially available glass substrate covered with indium tin-oxide is patterned by etching to form electrode 12. After etching, the indium tin-oxide electrode and substrate are cleaned ultrasonically in isopropyl alcohol, blown dry with nitrogen and irradiated in a UV-ozone chamber for approximately twenty minutes. A layer of a light emitter 15 composed of an insulating material and a light-emitting material is then coated onto the electrode using a spin-casting technique. The technique involves dissolving the light-emitter or the insulating and light-emitting material components thereof in a suitable solvent, placing a few drops on the electrode covered substrate, and spinning the substrate using a commercially available spin-casting device.

After drying the light emitter 15, a suitable electrode 18 is deposited on the light emitter 15 using conventional vacuum evaporation techniques at approximately $10^{-6}$ torr. To avoid damage to the organic light-emitting material during the electrode deposition step, the device is mounted on a cooled surface during deposition of the electrode. Typically, a water cooled surface is sufficient to prevent damage to the organic materials found in the device.

The spin casting technique is conventional and well-known in the art. However, it is to be noted that a wide variety of other well known methods may also be used to obtain the layered structure shown in FIG. 1 including doctor blading, dip coating, chemical vapor deposition, physical vapor evaporation, sputtering, and Langmuir-Blodgett techniques. Spin casting is preferred due to the ease of fabrication and uniformity of the resulting thin films.

The electrodes 12 and 18 are connected to a voltage source 24 by means of suitable electrical connectors or contacts 26. These electrical connectors and contacts are conventional in the art and include wire leads, printed circuit connectors, spring clips, snaps, solder, wrapped posts, conducting glues, and so forth. It is also to be understood that the electrical connector or contact 26 can be the electrodes 12 and 18 themselves. That is, the potential difference 24 may be applied directly to the electrodes in which case electrodes 12 and 18 become the electrical contact or connector.

As noted previously, voltage source 24 may be either a direct current voltage source producing a direct current (DC) or an alternating voltage source producing an alternating current (AC). It has generally been found that the devices shown in FIG. 1 are capable of being driven in either a forward or reverse direction using a direct voltage source or with an alternating voltage source. In both instances the turn-on voltage has been found to be less than about 24 V, usually less than about 12 V, typically less than about 6 V and even less than about 5 V. As such, the device finds wide application in a wide variety of semiconductor and low voltage applications.

Figure 4:
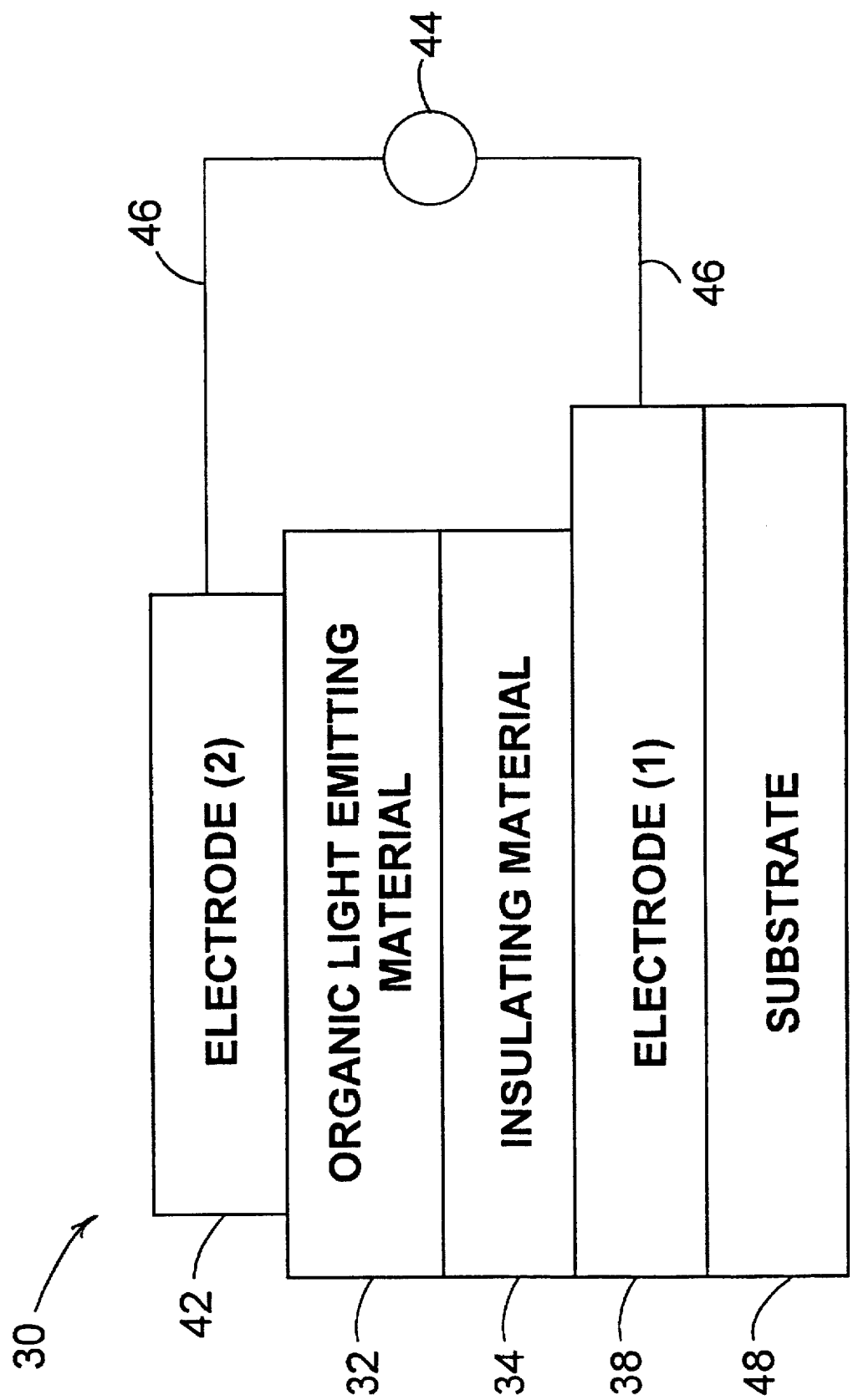
FIG. 4 is a schematic drawing of an alternate embodiment of the present invention showing the light emitter formed as a layer of insulating material and a layer of light-emitting material.

In the alternate embodiment 30 shown in FIG. 4, the light emitter is formed as two layers, an insulating material layer 34 and the organic light-emitting material layer 32. In this embodiment, substrate 48 and the first electrode 38 are formed in a fashion similar to that discussed above for substrate 28 and electrode 12 in FIG. 1. A layer of an insulating material 34 is then coated onto the electrode using the spin-casting technique which in this case involves dissolving the insulator material in a suitable solvent, placing a few drops on the electrode covered substrate and spinning the substrate using the spin casting device.

After drying the insulator material layer 34 in a dynamic vacuum, a layer of light-emitter material is then coated onto the insulating material layer 34 again using a spin-casting technique. Here the light-emitting material is dissolved in a suitable solvent, placed on the insulator material layer 34 and spun in the spin-casting device. It is noted that care must be used in the selection of solvents so as to avoid dissolving the previously deposited insulating material layer 34. After drying the organic light-emitter material layer 32, a suitable second electrode 42 is deposited on the light-emitting material layer 32 using conventional vacuum evaporation techniques at approximately $10^{-6}$ torr. This electrode preferably has a lower electron work function than the electrode in contact with the insulating layer. Thus, if the electrode contacting the insulation layer is indium tin oxide, an electrode such as aluminum or calcium may be used as the second electrode. As noted previously, to avoid damage to the organic light-emitting material 32 during the electrode deposition step, the device is mounted on a cooled surface during deposition of electrode.

The following examples are offered to further illustrate the various specific and/or preferred embodiments and techniques. It is to be understood, however, that many variations and modifications may be made while remaining within the scope of the present invention. Additional examples, figures and explanatory text are found in our copending application Ser. No. 08/396,465, filed Mar. 2, 1995 having a common assignee incorporated by reference as if completely written herein.

EXAMPLE I

Indium Tin-Oxide/Poly(p-pyridine) and Nylon/Aluminum Device

An indium tin-oxide (ITO) coated glass substrate from Delta Technologies, Ltd., Stillwater, Minn., was etched using photolithographic techniques to produce a patterned first electrode. After etching was complete, the etched ITO glass was cleaned by sonication in isopropyl alcohol for 20–30 minutes. The etched ITO glass was blown dry with $N_2$ and then irradiated in a UV-Ozone chamber for 10 minutes.

A formic acid solution of a 1:10 wt.wt ratio of the light emitting material poly(p-pyridine) (PPy) and nylon insulating material was made by mixing a solution of 2 drops of PPy solution formed by mixing 1 ml of formic acid with 10 mg of PPy powder and 10 drops of a nylon solution formed by mixing 1 ml of formic acid with 20 mg of nylon. The light emitting PPy was synthesized by a reductive metal mediated coupling polymerization as described by Yamamoto et al. in *Chemistry Letters*, 153–154 (1988). The nylon was nylon 6/6 (from adipic acid and 1,6-hexanediamine) purchased from the Aldrich Chemical Company (Milwaukee, Wis.).

This solution was then used to spin coat a thin film of nylon and PPy onto the etched ITO glass. Several drops of the nylon/PPy solution were placed on the etched ITO glass substrate and the substrate was spun at 2000 rpm for 15 seconds using a Photo Resist Spinner (EC101DT) made by Headway Research, Inc. Garland, Tex. The resulting film was dried in a dynamic vacuum at $10^{-3}$ torr. Aluminum (Al) was then evaporated onto the PPy/nylon layer to form a second electrode using conventional vacuum vapor deposition methods at pressures below about $4 \times 10^{-6}$ torr. Thin copper wires were attached to the ITO electrode and the Al electrode using a silver paste (Du Pont Conductor Composition #5007 made by the Du Pont Company of Wilmington, Del.). The paste was allowed to dry for about 12–24 hours.

The current-voltage characteristics of the device were measured using two Keithley 195A multimeters. One was set to record voltage and the other was set to record current. The output of the Keithley multimeters was recorded with an IBM compatible 486DX-66 MHz computer via a National Instruments (Austin, Tex.) general purpose interface bus (GPIB) card. The same procedure was used to test in reverse bias except that the ground and positive wires were switched at the power supply. The voltage was varied from 0 to 20 volts in the forward bias hookup and from 0 to −20 volts in the reverse bias hookup. The light produced by the device appeared whitish blue to the human eye and became visible at +12 volts in forward bias hookup and at −12 volts in reverse hookup.

Figure 2:
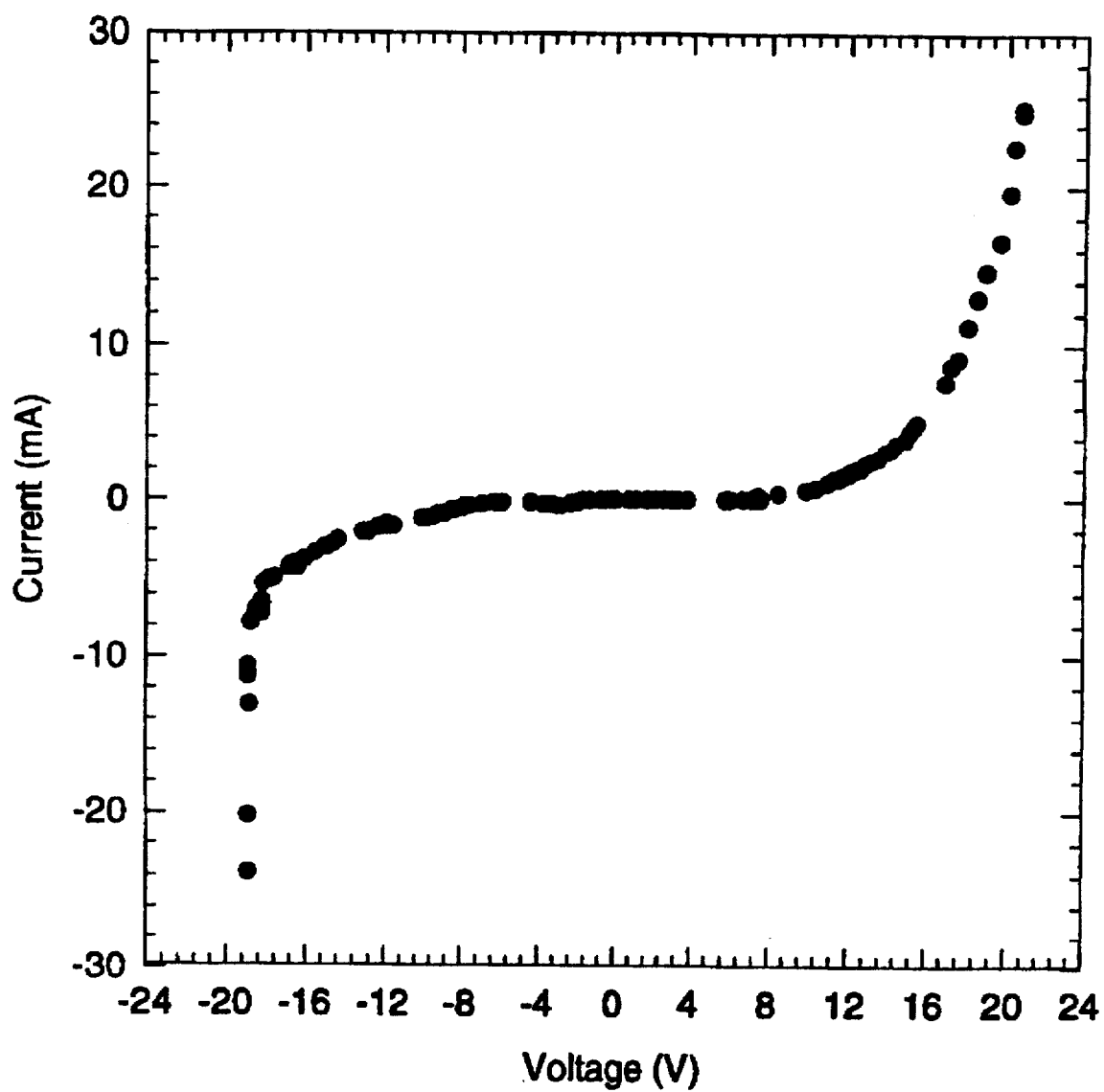
FIG. 2 is a current voltage (I-V) curve for an Indium Tin-Oxide/Poly(p-pyridine) and Nylon/Aluminum device of Example 1 showing voltage on the horizontal axis in volts (V) and current on the vertical axis in milliamperes (mA).

FIG. 2 shows the current versus voltage characteristics of a typical ITO/PPy and Nylon/Al device. The turn-on voltage for the particular device tested was +12 volts in forward bias and −12 volts in reverse bias. The symmetry of the current-voltage (I-V) curve shows that the device worked equally well under forward and reverse DC bias in spite of the fact that the electrodes have different work functions.

EXAMPLE II

Indium Tin-Oxide/Poly(p-pyridine) and Polymethylmethacrylate/Aluminum Device

The device was prepared according to the method of Example I except that the PPy solution was prepared from a solution of 18.5 mg of PPy dissolved in one milliliter of formic acid and polymethylmethacrylate (PPMA) was substituted for nylon and was prepared by dissolving 20 mg of PPMA in one milliliter of formic acid. The light emitter solution was prepared by mixing one drop of the PPy solution with 8 drops of the PPMA solution. A few drops of the resulting light emitter solution were used for spin casting. Operating characteristics were similar to those for Example I except that turn-on voltages were considerably lower. The DC turn-on voltage was ±7 volts (for forward and reverse bias).

EXAMPLE III

Indium Tin-Oxide/Poly(p-pyridylvinylene and Polymethylmethacrylate/Aluminum Device The method of Example II was followed except that the PPy solution was replaced by a solution of poly(p-pyridylvinylene) (PPyV). The PPyV solution was prepared by adding 1 ml of formic acid to 20 mg of PPyV. PPyV was prepared according to the method of Marsilla et al., *Polymer Preprints* 33(1), 1196 (1993). The resulting solution was sonicated to ensure the material dissolution. The light emitter solution was prepared from 1 drop of PPyV solution and 10 drops of PMMA solution. A few drops of the light emitter solution were used for spin casting.

The device was tested in a fashion similar to Example I. The DC turn-on voltages were +5 volts for forward bias and −5 volts for reverse bias. The device emitted an orange light visible to the human eye.

EXAMPLE IV

Indium Tin-Oxide/Emeraldine Base/Poly(p-pyridine)/Aluminum Device

An indium tin-oxide (ITO) coated glass substrate was prepared as detailed in Example I. A 0.5% solution of the emeraldine base (EB) form of polyaniline in N-methylpyrrolidone (NMP) was prepared by mixing 5.0 milligrams of EB having an imine/amine ratio of about 1.2 in 1.0 milliliters of NMP. The resulting solution was sonicated and filtered if necessary. Emeraldine base was prepared by the method of MacDiarmid et al. disclosed in *Faraday Discussion Chemical Society*, 88, 317–332 (1989). A solution of poly(p-pyridine) (PPy) was made by adding 1 ml of formic acid to 11.0 mg of PPy powder. PPy was synthesized by a reductive metal mediated coupling polymerization as described by Yamamoto et al. in *Chemistry Letters*, 153–154 (1988).

These solutions were then used to spin coat thin films of EB and PPy onto the etched ITO glass. Several drops (3–5) of the EB/NMP solution were placed on the etched ITO glass substrate and the substrate was spun at 2000 rpm for 15 seconds using a Photo Resist Spinner (EC101DT) made by Headway Research, Inc., Garland, Tex. The resulting insulator film was dried in a dynamic vacuum at $10^{-3}$ torr. After drying, 3–5 drops of the PPy formic acid solution were placed on the EB film coated ITO glass substrate and the substrate was spun at 2000 rpm for 15 seconds to afford a layer of organic light-emitting electroluminescent material. The final ITO/EB/PPy substrate was again dried under dynamic vacuum at $10^{-3}$ torr. Aluminum (Al) was then evaporated onto the PPy layer to form a second electrode using conventional vacuum vapor deposition methods at pressures below about $4 \times 10^{-6}$ torr. Thin copper wires were attached to the ITO electrode and the Al electrode using a silver paste (Du Pont Conductor Composition #5007 made by the Du Pont Company of Wilmington, Del.). The paste was allowed to dry for about 12–24 hours.

The current-voltage characteristics were determined according to the procedure outlined in Example I. The light produced by the device appeared whitish blue to the human eye and became visible at +10 volts in forward bias hookup and at −10 volts in reverse hookup.

Figure 3:
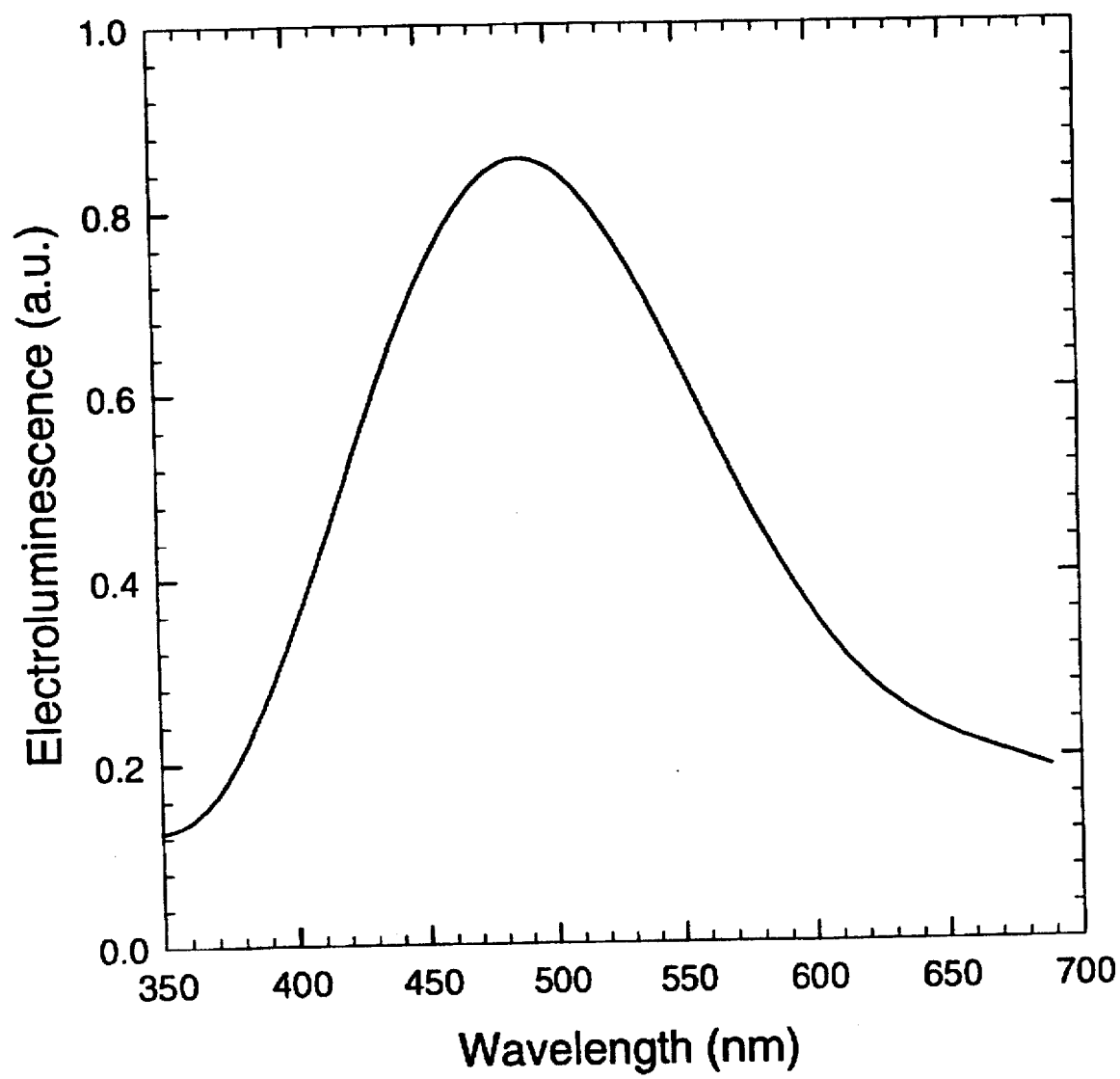
FIG. 3 is the electroluminescence spectrum of Indium Tin-Oxide/Emeraldine Base/Poly(p-pyridine)/Aluminum device of Example IV showing wavelength in nanometers on the horizontal axis and electroluminescence intensity in arbitrary units (a.u.) on the vertical axis.

The electroluminescent spectrum was measured and recorded rising a Quantamaster Model QM-1 Fluorometer (Photon Technology International Inc., South Brunswick, N.J.). A maximum intensity peak was observed at about 490 nm. The spectrum is shown in FIG. 3.

EXAMPLE V

Indium Tin-Oxide/Emeraldine Base/Poly(p-pyridyivinylene)/Aluminum Device

The device was prepared according to the method of Example IV except that the PPy electrode was replaced by PPyV. The PPyV was prepared according to the method noted in Example III. A PPyV solution was prepared by dissolving 20 mg of PPyV in one milliliter of formic acid. Operating test results were similar to Example IV except that the DC turn-on voltage was observed at ±4–5 volts (forward and reverse bias).

EXAMPLE VI

Indium Tin-Oxide/Emeraldine Base and 2-(4-biphenyl)-5-(4-tert-butylphenyl-1,3,4-Oxadiazole/Poly(p-pyridine)/Aluminum Device The solution of Emeraldine Base (EB) in Example IV was replaced by a solution made from a mixture of EB and 2-(4-biphenyl)-5-(4-tert-butylphenyl-1,3,4-oxadiazole (PBD). The EB and PBD solution was prepared by mixing 1.6 mg of EB powder and 5.0 mg of PBD in 2 ml of N-methylpyrrolidone (NMP). The PBD was purchased from the Aldrich Company (Milwaukee, Wis.). The DC turn-on voltages were ±10 volts in forward and reverse bias.

EXAMPLE VII

Indium Tin Oxide/Emeraldine Base and 2-4-biphenyl)-5-(4-tert-butylphenyl-1,3,4-Oxadiazole/Poly(p-pyridylvinylene)/Aluminum Device The method of Example VI was followed except that the PPy was replaced by PPyV prepared according to the method of Example V. The DC turn-on voltages were as low as +6 volts for a forward bias and −6 volts for reverse bias.

EXAMPLE VIII

Indium Tin-Oxide/Polymethylmethacrylate/Poly(p-pyridine)/Aluminum Device

Figure 5:
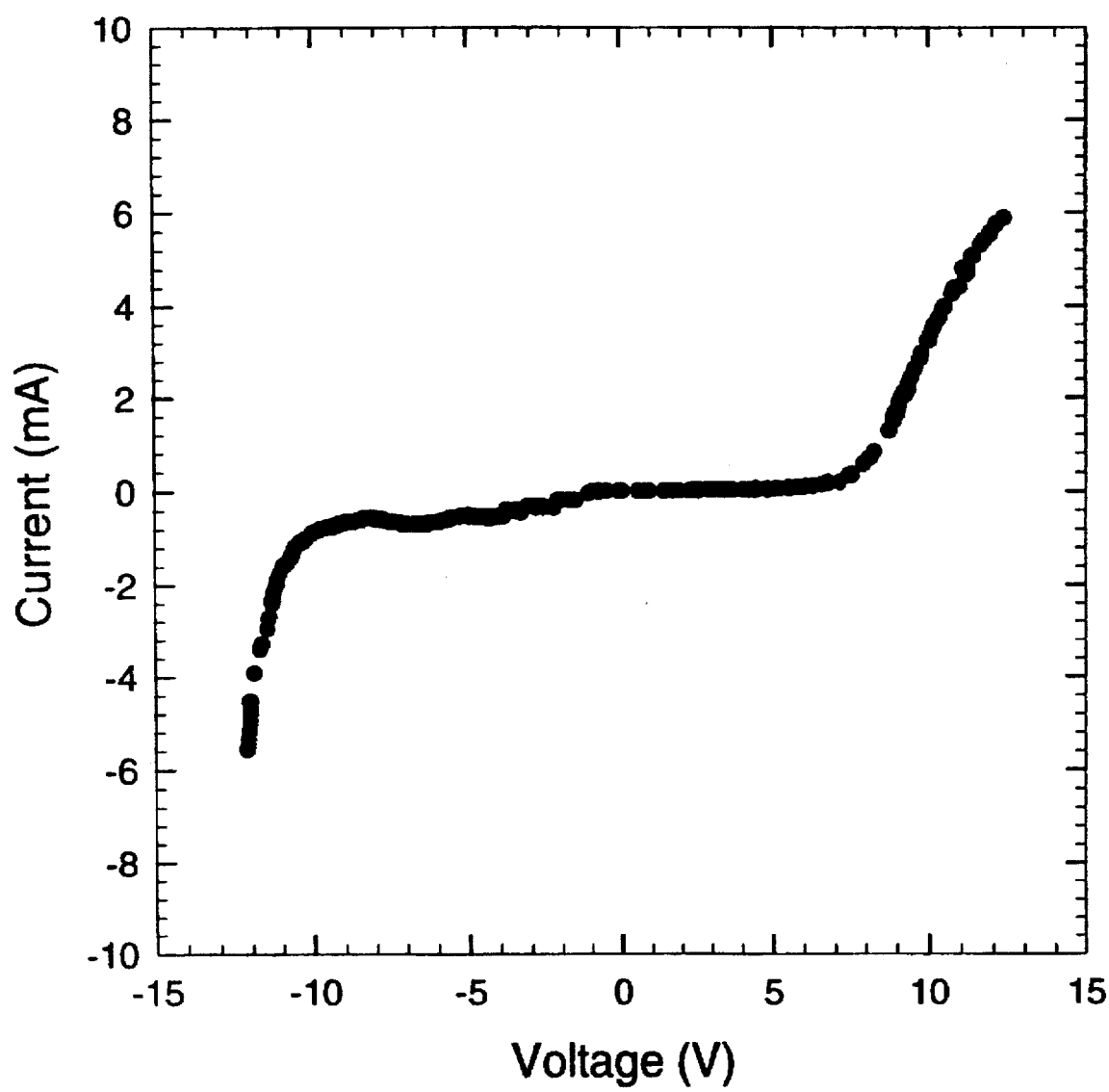
FIG. 5 is a current voltage (I-V) curve for Indium Tin-Oxide/Polymethylmethacrylate/Poly(p-pyridine)/Aluminum device Example VIII showing voltage on the horizontal axis in volts (V) and current on the vertical axis in milliamperes (mA).

The device was prepared according to the method of Example VI except that polymethylmethacrylate (PPMA) was substituted for the mixture of EB and PBD. The PMMA solution was prepared by dissolving 20 mg of PMMA in 1 ml of formic acid. FIG. 5 shows the current versus voltage characteristics of a typical ITO/PPMA/PPy/Al device. The turn-on voltage for the particular device tested was +10 volts in forward bias and −10 volts in reverse bias.

EXAMPLE IX

Figure 6:
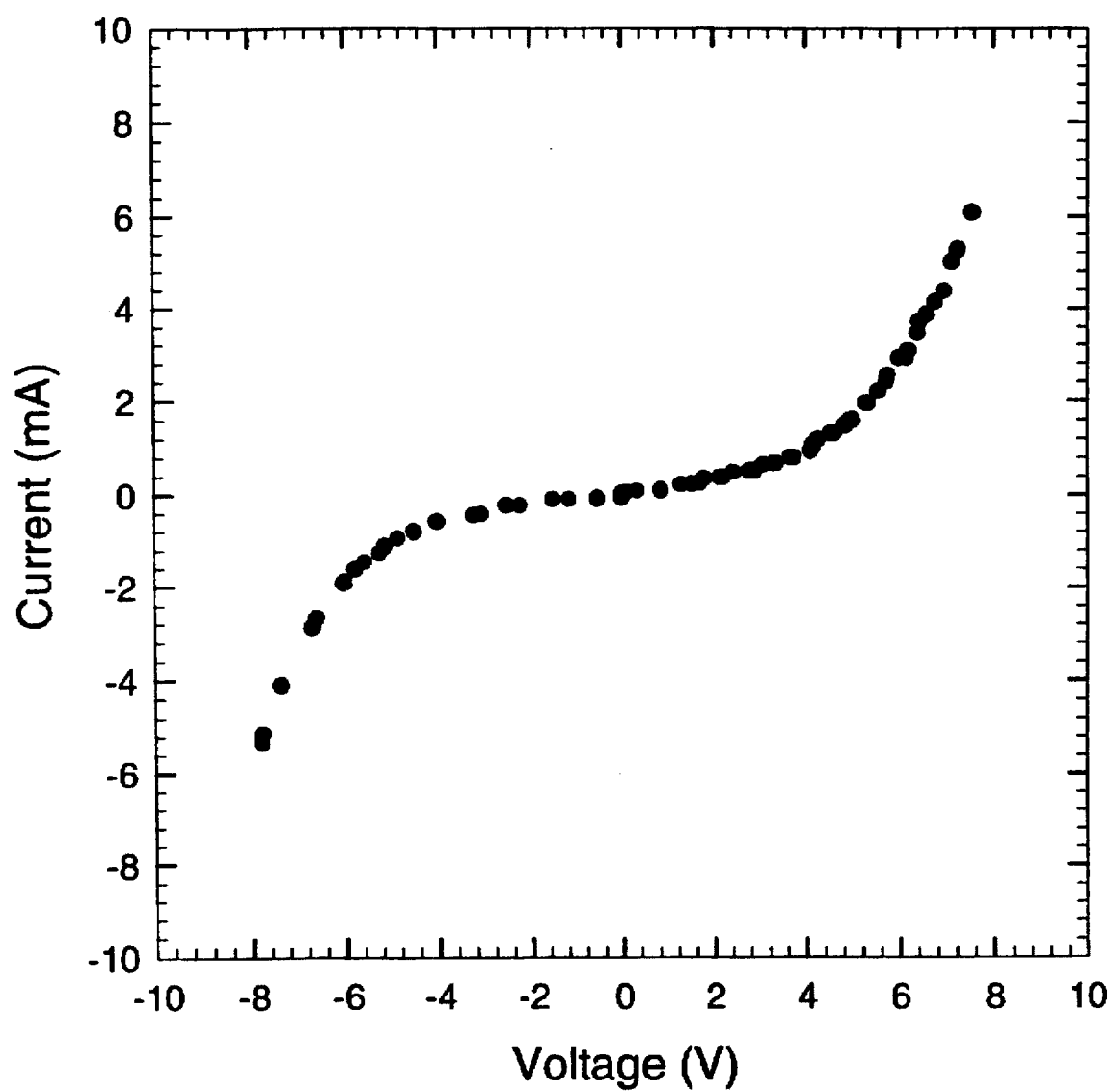
FIG. 6 is a current voltage (I-V) curve for the Indium Tin Oxide/Polymethylmethacrylate/Poly(p-pyridylvinylene)/

Indium Tin Oxide/Polymethylmethacrylate/Poly(p-pyridylvinylene)/Aluminum Device The method of Example VII was followed except that the PPy was replaced by PPyV prepared according to the method of Example V. The current-voltage characteristics were determined according to the procedure outlined in Example I. FIG. 6 shows the current versus voltage characteristics of a typical ITO/PMMA/PPyV/Al device. The light produced by the device appeared orange to the human eye and became visible at +6 volts in forward bias hookup and at −6 volts in reverse hookup. The symmetry of the current-voltage (I-V) curve shows that the device worked equally well under forward and reverse DC bias in spite of the fact that the electrodes have different work functions.

The device was tested in AC mode using a Hewlett Packard Model HP3311A Function Generator (Houston, Tex.). The light output was observed at double the frequency of the function generator. The light was measured using a photomultiplier (PMT) (Type R928, Hamamatsu Photonics K.K., Shimukanzo, Japan) driven by a high voltage power supply (PS350 made by Stanford Research System, Palo Alto, Calif.) and an oscilloscope (Model 2430A made by Tektronix, Inc., Beaverton, Oreg.). The voltage was simultaneously measured with the same oscilloscope. The data was recorded using a GPIB card-equipped computer.

FIG. 7 shows the light intensity and AC voltage as a function of time. The AC voltage varies from about +9 to about −9 volts with a frequency of 60 Hz. The intensities of the light peaks at both +9 and −9 volts are of about equal intensity demonstrating that the dependance of light intensity is generally independent of the work function of the electrodes. The device was found to operate in a frequency range from about 1 Hz to about 100 kHz. The light output was reduced considerably above 100 kHz.

TABLE I

Direct Current (DC) Turn-On Voltages

| Example | DC Turn-On Voltage |
| --- | --- |
| I | ±12 V |
| II | ±7 V |
| III | ±5 V |
| IV | ±10 V |
| V | ±4 to ±5 V |
| VI | ±10 V |
| VII | ±6 V |
| VIII | ±10 V |
| IX | ±6 V |

It is possible that changes in configurations to other than those shown could be used but that which is shown if preferred and typical. Without departing from the spirit of this invention, various means of fastening the components together may be used.

It is therefore understood that although the present invention has been specifically disclosed with the preferred embodiment and examples, modifications to the design concerning sizing and shape will be apparent to those skilled in the art and such modifications and variations are considered to be equivalent to and within the scope of the disclosed invention and the appended claims.

It is to be understood that although the present invention has been specifically disclosed with the preferred embodiment and examples, modifications to the experimental design may be apparent to those skilled in the art and such modifications and variations are considered to be within the scope of the invention and the appended claims. It is also intended that all matter contained in the above description shall be interpreted as illustrative and not in a limiting sense, the scope of the invention being indicated by the appended claims rather than by the foregoing description, and all changes that come within the meaning and range of equivalency of the claims are therefore intended to be embraced therein. That is, the following claims are intended to cover all of the generic and specific features of the invention herein described, and all statements of the scope of the invention which, as a matter of language, fall therebetween. Furthermore, it is to be understood that in the following claims, ingredients or compounds recited in the singular are intended to include compatible mixtures of such ingredients wherever the sense permits. The present invention may suitably comprise, consist of, or consist essentially of the light emitter, first electrode, and second electrode. The light emitter may suitably comprise, consist of, or consist essentially of the light emitting material and the insulating material. The invention illustratively disclosed herein suitably may be practiced in the absence of any element which is not specifically disclosed herein.

We claim:

1. A bipolar electroluminescent device comprising:
    a. a light emitter operating in both a forward and a reverse current direction and comprising an electroluminescent organic light emitting means in contact with an insulating means;
    b. a first electrode means in contact with said light emitter and for electrically connecting said first electrode to a potential difference; and
    c. a second electrode means in contact with said light emitter and in spaced relation with said first electrode and for electrically connecting said second electrode to said potential difference.

2. The bipolar electroluminescent device according to claim 1 wherein said potential difference is an alternating potential difference.

3. The bipolar electroluminescent device according to claim 1 wherein said insulating means is selected from the group of insulating means consisting of ceramic insulating means, organic insulating means, and inorganic polymer insulating means.

4. The bipolar electroluminescent device according to claim 3 with said insulating means being an organic insulating means.

5. The bipolar electroluminescent device according to claim 4 wherein said organic insulating means is selected from the group of organic insulating means consisting of conjugated polymers, acrylic polymers, nylon polymers, polyvinylcarbazoles, copolymers thereof, organic insulating molecules, and mixtures thereof.

6. The bipolar electroluminescent device according to claim 5 with said organic insulating means being a conjugated polymer.

7. The bipolar electroluminescent device according to claim 6 with said conjugated polymer being a polyaniline polymer.

8. The bipolar electroluminescent device according to claim 7 with said polyaniline polymer being a polyaniline emeraldine base.

9. The bipolar electroluminescent device according to claim 5 with said organic insulating means being an organic insulating molecule.

10. The bipolar electroluminescent device according to claim 9 with said organic insulating molecule being dispersed in a host polymer.

11. The bipolar electroluminescent device according to claim 10 with said insulating organic molecule being 2-(4-biphenyl)-5-(4-tert-butylphenyl-1,3,4-oxadiazole).

12. The bipolar electroluminescent device according to claim 10 with said host polymer being emeraldine base.

13. The bipolar electroluminescent device according to claim 11 with said host polymer being emeraldine base.

14. The bipolar electroluminescent device according to claim 10 with said host polymer being polyvinylcarbazole.

15. The bipolar electroluminescent device according to claim 11 with said host polymer being polyvinylcarbazole.

16. The bipolar electroluminescent device according to claim 5 with said organic insulating means being an acrylic polymer.

17. The bipolar electroluminescent device according to claim 16 with said acrylic polymer being polymethylmethacrylate.

18. The bipolar electroluminescent device according to claim 3 with said insulating means being a ceramic insulating means.

19. The bipolar electroluminescent device according to claim 18 with said ceramic insulating means being aluminum oxide.

20. The bipolar electroluminescent device according to claim 1 wherein said insulating means is at least partially transparent.

21. The bipolar electroluminescent device according to claim 1 wherein said electroluminescent organic light-emitting means is selected from the group of organic light-emitting means consisting of electroluminescent organic light-emitting molecules and electroluminescent organic light-emitting polymers.

22. The bipolar electroluminescent device according to claim 21 with said electroluminescent organic light-emitting means being an electroluminescent organic light-emitting polymer.

23. The bipolar electroluminescent device according to claim 22 wherein said electroluminescent organic light-emitting polymer is a polymer selected from the group of electroluminescent polymers consisting of polypyridines, polypyridylvinylenes, polyphenylenes, polyphenylenevinylenes, polythiophenes, polyvinylcarbazoles, polyfluorenes, polynaphthalenevinylenes, polyphenyleneacetylenes, polyphenylenediacetylenes, polycyanoterephthalylidenes, polyphenylenebenzobisthiazoles, polybenzimidazobenzophenanthrolines, copolymers thereof, and mixtures thereof.

24. The bipolar electroluminescent device according to claim 23 with said electroluminescent polymer being a polypyridine.

25. The bipolar electroluminescent device according to claim 24 with said polypyridine being poly(p-pyridine).

26. The bipolar electroluminescent device according to claim 23 with said electroluminescent organic polymer being a copolymer.

27. The bipolar electroluminescent device according to claim 26 wherein said electroluminescent copolymer is poly(phenylenevinylene pyridylvinylene).

28. The bipolar electroluminescent device according to claim 23 with said electroluminescent organic polymer being an electroluminescent polyphenylene.

29. The bipolar electroluminescent device according to claim 23 with said electroluminescent organic polymer being a polyphenylenevinylene.

30. The bipolar electroluminescent device according to claim 29 with said electroluminescent polyphenylenevinylene being poly(p-phenylenevinylene).

31. The bipolar electroluminescent device according to claim 23 with said electroluminescent organic polymer being a polyphenylenebenzobisthiazole.

32. The bipolar electroluminescent device according to claim 1 with at least one of said first electrode means and said second electrode means being an electrode means that is at least partially transparent.

33. The bipolar electroluminescent device according to claim 1 with at least one of said first electrode means and said second electrode means being an electrode means selected from the group of electrode means consisting of In—SnO$_2$, metals, alloys, conducting non-metals, and highly conducting organic polymers.

34. The bipolar electroluminescent device according to claim 33 with said electrode means being In—SnO$_2$.

35. The bipolar electroluminescent device according to claim 1 further comprising a substrate in contact with one of said first electrode means and said second electrode means.

36. The bipolar electroluminescent device according to claim 35 wherein said substrate is at least partially transparent.

37. The bipolar electroluminescent device according to claim 35 with said substrate being electrically non-conducting.

38. The bipolar electroluminescent device according to claim 35 wherein said substrate is selected from the group of substrates consisting of glass and plastic.

39. The bipolar electroluminescent device according to claim 38 with said substrate being glass.

40. The bipolar electroluminescent device according to claim 39 with said electrode means contacting said substrate being In—SnO$_2$.

41. The bipolar electroluminescent device according to claim 1 having a turn-on voltage of less than about 24 volts.

42. The bipolar electroluminescent device according to claim 1 having a turn-on voltage of less than about 12 volts.

43. The bipolar electroluminescent device according to claim 1 having a turn-on voltage of less than about 6 volts.

44. The bipolar electroluminescent device according to claim 1 having modulated light output.

45. The bipolar electroluminescent device according to claim 44 having frequency modulated light output.

46. The bipolar electroluminescent device according to claim 44 having amplitude modulated light output.

47. The bipolar electroluminescent device according to claim 1 wherein said light emitter is a mixture of said light emitting means and said electrical insulating means.

48. The bipolar electroluminescent device according to claim 47 wherein said potential difference is an alternating potential difference.

49. The bipolar electroluminescent device according to claim 47 with said electrical insulating means comprising an electrically insulating organic polymer.

50. The bipolar electroluminescent device according to claim 49 with said electrically insulating organic polymer being a nylon.

51. The bipolar electroluminescent device according to claim 50 with said electrically insulating organic nylon polymer being formed from adipic acid and 1,6-hexanediamine.

52. The bipolar electroluminescent device according to claim 49 with said electrically insulating organic polymer being polymethylmethacrylate.

53. The bipolar electroluminescent device according to claim 47 with said electroluminescent organic light emitting means being an electroluminescent organic light-emitting polymer.

54. The bipolar electroluminescent device according to claim 53 with said electroluminescent organic light emitting polymer being a polypyridine.

55. The bipolar electroluminescent device according to claim 54 with said electroluminescent organic light emitting polypyridine being poly(p-pyridine).

56. The bipolar electroluminescent device according to claim 53 with said electroluminescent organic light emitting polymer being a polyphenylenevinylene.

57. The bipolar electroluminescent device according to claim 53 with said electroluminescent organic light emitting polymer being a polypyridylvinylene.

58. The bipolar electroluminescent device according to claim 1 wherein said light emitter is formed as a layer of said light emitting means in contact with a layer of said electrical insulating means and said first electrode means is in contact with said electrical insulating means and said second electrode means is in contact with said light emitting means and said second electrode means has a lower electron work function than said first electrode means.

59. The bipolar electroluminescent device according to claim 58 wherein said potential difference is an alternating potential difference.

60. The bipolar electroluminescent device according to claim 58 with said electrical insulating means comprising an electrically insulating organic polymer.

61. The bipolar electroluminescent device according to claim 60 with said electrically insulating organic polymer being an insulating polyaniline.

62. The bipolar electroluminescent device according to claim 61 with said electrically insulating organic polyaniline polymer being emeraldine base.

63. The bipolar electroluminescent device according to claim 60 with said electrically insulating organic polymer being polymethylmethacrylate.

64. The bipolar electroluminescent device according to claim 58 with said electrically insulating means being a mixture of insulating emeraldine base and 2-(4-biphenyl)-5-(4-tertbutylphenyl-1,3,4-oxadiazole.

65. The bipolar electroluminescent device according to claim 58 with said electroluminescent organic light emitting means being an electroluminescent organic light-emitting polymer.

66. The bipolar electroluminescent device according to claim 65 with said electroluminescent organic light emitting polymer being a polypyridine.

67. The bipolar electroluminescent device according to claim 65 with said polypyridine being poly(p-pyridine).

68. The bipolar electroluminescent device according to claim 65 with said electroluminescent organic light emitting polymer being polyphenylenevinylene.

69. The bipolar electroluminescent device according to claim 65 with said electroluminescent organic light emitting polymer being a polypyridylvinylene.

70. The bipolar electroluminescent device according to claim 58 wherein said first electrode means is indium tin oxide and said second electrode means is aluminum.

* * * * *